(12) United States Patent
Cheng et al.

(10) Patent No.: US 9,728,625 B2
(45) Date of Patent: Aug. 8, 2017

(54) FIN FORMATION IN FIN FIELD EFFECT TRANSISTORS

(71) Applicant: INTERNATIONAL BUSINESS MACHINES CORPORATION, Armonk, NY (US)

(72) Inventors: Kangguo Cheng, Schenectady, NY (US); Bruce B. Doris, Slingerlands, NY (US); Hong He, Schenectady, NY (US); Ali Khakifirooz, Los Altos, CA (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/976,867

(22) Filed: Dec. 21, 2015

(65) Prior Publication Data

US 2016/0111525 A1    Apr. 21, 2016

Related U.S. Application Data

(63) Continuation of application No. 14/584,790, filed on Dec. 29, 2014.

(60) Provisional application No. 61/984,484, filed on Apr. 25, 2014.

(51) Int. Cl.
*H01L 29/66* (2006.01)
*H01L 21/225* (2006.01)
*H01L 29/78* (2006.01)
*H01L 21/306* (2006.01)
*H01L 29/06* (2006.01)

(52) U.S. Cl.
CPC .... *H01L 29/66795* (2013.01); *H01L 21/2254* (2013.01); *H01L 21/30604* (2013.01); *H01L 29/0649* (2013.01); *H01L 29/66545* (2013.01); *H01L 29/785* (2013.01)

(58) Field of Classification Search
CPC ......... H01L 29/66795; H01L 21/30604; H01L 29/0649; H01L 29/66545; H01L 29/785; H01L 21/2254
See application file for complete search history.

(56) References Cited

U.S. PATENT DOCUMENTS

| | | | |
|---|---|---|---|
| 7,767,560 B2 | 8/2010 | Jin et al. |
| 7,851,790 B2 | 12/2010 | Rachmady et al. |
| 8,048,723 B2 | 11/2011 | Chang et al. |
| 8,283,653 B2 | 10/2012 | Pillarisetty et al. |
| 8,394,690 B2 | 3/2013 | Ikeda et al. |

(Continued)

FOREIGN PATENT DOCUMENTS

TW        201125105 A      7/2011

OTHER PUBLICATIONS

List of IBM Patents or Patent Applications Treated as Related dated Dec. 21, 2015, 2 pages.

*Primary Examiner* — Michael Jung
*Assistant Examiner* — Charles R Peters
(74) *Attorney, Agent, or Firm* — Tutunjian & Bitetto, P.C.; Vazken Alexanian

(57) ABSTRACT

A method of forming a semiconductor device that includes forming a silicon including fin structure and forming a germanium including layer on the silicon including fin structure. Germanium is then diffused from the germanium including layer into the silicon including fin structure to convert the silicon including fin structure to silicon germanium including fin structure.

17 Claims, 10 Drawing Sheets

(56) References Cited

U.S. PATENT DOCUMENTS

| | | |
|---|---|---|
| 8,395,195 B2 | 3/2013 | Chang et al. |
| 2005/0093154 A1 | 5/2005 | Kottantharayil et al. |
| 2005/0248003 A1 | 11/2005 | Tsybeskov et al. |
| 2010/0144121 A1 | 6/2010 | Chang et al. |
| 2010/0164102 A1 | 7/2010 | Rachmady et al. |
| 2012/0025313 A1 | 2/2012 | Chang et al. |
| 2014/0175543 A1* | 6/2014 | Glass .............. H01L 21/823431 257/337 |
| 2014/0252475 A1* | 9/2014 | Xu ........................ H01L 29/785 257/347 |
| 2015/0214369 A1* | 7/2015 | Fronheiser .......... H01L 29/0847 257/192 |

* cited by examiner

FIN FORMATION IN FIN FIELD EFFECT TRANSISTORS

RELATED APPLICATION INFORMATION

This application claims priority to non-provisional application Ser. No. 14/584,790, entitled "FIN FORMATION IN FIN FIELD EFFECT TRANSISTORS" that was filed on Dec. 29, 2014, which claims priority to provisional application Ser. No. 61/984,484, entitled "FIN FORMATION IN FIN FIELD EFFECT TRANSISTORS" that was filed on Apr. 25, 2014, incorporated herein by reference.

BACKGROUND

Technical Field

The present disclosure relates to semiconductor devices, such as semiconductor devices including fin structures. The present disclosure further relates to processing of materials suitable for use in fin including structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method is disclosed for forming a silicon germanium including fin structure for use in a semiconductor device. The method may include forming a silicon including fin structure having an upper surface that is planar to a (100) crystal plane and a sidewall surface that is planar to a (100) crystal plane, and forming a germanium including layer on the upper surface and sidewalls surface of the silicon including fin structure. Germanium is then diffused from the germanium including layer into the silicon including fin structure to convert the silicon including fin structure to a silicon germanium including fin structure.

In another embodiment, the method includes forming a plurality of silicon including fin structures, and forming a gate structure on a channel portion of the plurality of silicon including fin structures. A germanium including layer is formed on exposed portions of the plurality of fin structures on opposing sides on the channel portion. Dielectric regions are formed between adjacent fin structures of the plurality of silicon including fin structures. Germanium from the germanium including layer is diffused into the plurality of silicon including fin structures to convert at least one of a source region portion and a drain region portion of the plurality of silicon including fin structures to a silicon germanium including material.

In another embodiment, the method for forming the semiconductor devices includes forming a plurality of silicon including fin structures. A replacement gate structure is formed on a channel portion of the plurality of silicon including fin structures, and a dielectric material is formed on a source region portion and a drain region portion of the plurality of silicon including fin structures. The replacement gate structure is removed to expose the channel portion of the plurality of silicon including fin structures. A germanium including layer is formed on the channel portion of the plurality of silicon including fin structures. Germanium is diffused from the germanium including layer into the channel portion of the plurality of silicon including fin structures to convert the channel portion of the plurality of the silicon including fin structures to a silicon germanium including material.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
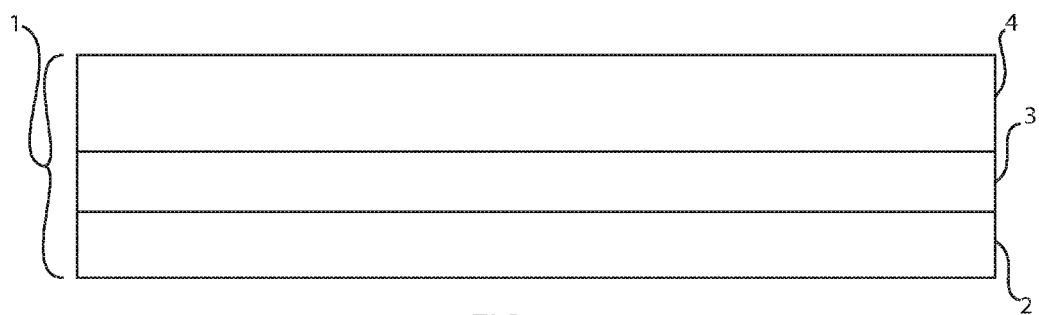
FIG. 1 is a side cross-sectional view that depicts a semiconductor on insulator (SOI) substrate as used to form a plurality of fin structures, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a silicon germanium including fin structure, e.g., SiGe fin structure, for use in semiconductor devices. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A finFET is a semiconductor device that positions the channel region of the semiconductor device in a fin structure. The methods and structures of the present disclosure are now discussed with more detail referring to FIGS. 1-18.

Figure 2:
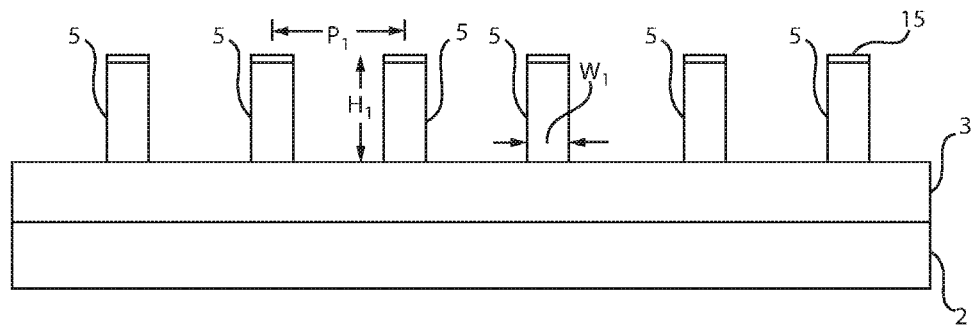
FIG. 2 is a side cross-sectional view depicting one embodiment of a plurality of silicon including fin structures, in accordance with the present disclosure.

FIGS. 1 and 2 depict one embodiment of forming a plurality of silicon including fin structures 5 from a semiconductor substrate 1. In some embodiments, the plurality of silicon including fin structures 5 may be formed from a semiconductor on insulator (SOI) substrate (as depicted in FIG. 1) or a bulk semiconductor substrate. Referring to FIG. 1, the SOI substrate that may provide the semiconductor substrate 1 may include at least a semiconductor on insulator (SOI) layer 4 overlying a dielectric layer 3, in which a base semiconductor layer 2 may be present underlying the dielectric layer 3. The semiconductor material that provides the SOI layer 4 may be a silicon including material. As used herein, the term "silicon including", as used to describe the SOI layer 4 and the subsequently formed plurality of fin structures 5, means a material layer of silicon that is substantially free of germanium. In some embodiments, by being substantially free of germanium, it is meant that the germanium content is less than 5 at. %. In some embodiments, the germanium content of the silicon including material may be higher, wherein the methods disclosed herein increase the germanium content of the silicon including material. In some embodiments, the silicon including material that provides the SOI layer 4 may include, but is not limited to silicon, single crystal silicon, multicrystalline silicon, polycrystalline silicon, amorphous silicon, strained silicon, silicon doped with carbon (Si:C), silicon alloys or any combination thereof. In one example, the SOI layer 4 is composed of silicon (Si). The SOI layer 4 can have a thickness ranging from 5.0 nm to 15.0 nm. In another example, the SOI layer 4 has a thickness ranging from 7.5 nm to 12.5 nm. The base semiconductor layer 2 may be a semiconducting material that may include, but is not limited to, Si, strained Si, SiC, SiGe, SiGeC, Si alloys, Ge, Ge alloys, GaAs, InAs, InP as well as other III/V and II/VI compound semiconductors. The base semiconductor layer 2 may have the same or a different composition than the SOI layer 4.

The dielectric layer 3 that may be present underlying the SOI layer 4 and atop the base semiconductor layer 2 may be formed by implanting a high-energy dopant into a bulk semiconductor substrate and then annealing the structure to form a buried insulating layer, i.e., dielectric layer 3. In another embodiment, the dielectric layer 3 may be deposited or grown prior to the formation of the SOI layer 4. In yet another embodiment, the SOI substrate may be formed using wafer-bonding techniques, where a bonded wafer pair is formed utilizing glue, adhesive polymer, or direct bonding.

It is noted that the semiconductor substrate 1 that provides the plurality of fin structures 5 is not limited to being a SOI substrate. The semiconductor substrate 1 that provides the plurality of fin structures 5 may also be a bulk semiconductor substrate. The bulk semiconductor substrate can be composed of a semiconducting material including, but not limited to silicon (Si), strained Si, SiC, SiGe, SiGeC, Si alloys, Ge, Ge alloys, GaAs, InAs, InP as well as other III/V and II/VI compound semiconductors.

Referring to FIG. 2, the plurality of fin structures 5 may be formed from the semiconductor substrate 1, e.g., SOI substrate, using photolithography and etch processes. Prior to etching the semiconductor substrate 1 to provide the plurality of fin structures 5, a layer of the dielectric material can be deposited atop the semiconductor substrate 1 to provide a dielectric fin cap 15. The material layer that provides the dielectric fin cap 15 may be composed of a nitride, oxide, oxynitride material, and/or any other suitable dielectric layer. The dielectric fin cap 15 may comprise a single layer of dielectric material or multiple layers of dielectric materials. The material layer that provides the dielectric fin cap 15 can be formed by a deposition process, such as chemical vapor deposition (CVD) and/or atomic layer deposition (ALD). Alternatively, the material layer that provides the dielectric fin cap 16 may be formed using a growth process, such as thermal oxidation or thermal nitridation. The material layer that provides the dielectric fin cap 15 may have a thickness ranging from 1 nm to 100 nm. In one example, the dielectric fin cap 15 is composed of an oxide, such as $SiO_2$, that is formed by CVD to a thickness ranging from 25 nm to 50 nm. In one embodiment, no dielectric fin cap is present on the upper surface of fin structures 5.

In one embodiment, following the formation of the layer of dielectric material that provides the dielectric fin cap 15, a photolithography and etch process sequence is applied to the material layer for the dielectric fin cap 15 and the semiconductor substrate 1. Specifically, in one example, a photoresist mask is formed overlying the layer of the dielectric material that provides dielectric fin cap 15 and is present overlying the SOI layer 4 of the semiconductor substrate 1, in which the portion of the dielectric material that is underlying the photoresist mask provides the dielectric fin cap 15, and the portion of the SOI layer 4 that is underlying the photoresist mask provides the plurality of fin structures 5. The exposed portions of the dielectric material that provides dielectric fin cap 15 and the SOI layer 4, which are not protected by the photoresist mask, are removed using a selective etch process. To provide the photoresist mask, a photoresist layer is first positioned on the layer of the dielectric material that provides dielectric fin cap. The photoresist layer may be provided by a blanket layer of photoresist material that is formed utilizing a deposition process such as, for example, CVD, plasma enhanced CVD (PECVD), evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the dielectric fin cap 15 followed by removing the unprotected portion of the SOI layer 4 selective to the underlying dielectric layer 3. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

Figure 3:
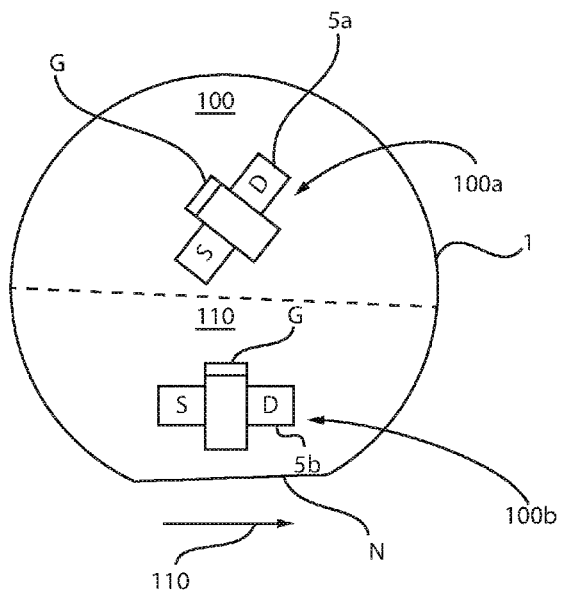
FIG. 3 is a top down view depicting one embodiment of a rotated substrate having fin structures formed thereon.

Referring to FIG. 3, in one embodiment, the semiconductor substrate 1 that provides the plurality of fin structures 5 is rotated 45 degrees prior to patterning and etching to form the plurality of fin structures 5. FIG. 3 depicts a finFET device 100a including a fin structure 5a that is formed on a semiconductor substrate 1 that has been rotated, wherein the source region is identified by S, the drain region is identified by D and the gate structure is identified by G. For comparison purposes, FIG. 3 also depicts a finFET device 100b including a fin structure 5b that is formed on a semiconductor substrate 1 that has not been rotated, wherein the source region is identified by S, the drain region is identified by D and the gate structure is identified by G. Typically, the notch N of a semiconductor substrate 1 is in a direction parallel to the (110) crystalline plane. When a length of a fin structure is formed in this direction the upper surface of the fin structure is planar to a (100) crystal plane and a sidewall surface that is planar to a (110) crystal plane. The epitaxially silicon germanium film is difficult to grow conformally on the sidewall surface of a fin structure having the (110) crystal plane. In some embodiments of the present disclosure, the semiconductor substrate is rotated 45° prior to forming the plurality of silicon including fin structures 5. In some embodiments, the semiconductor substrate is rotated so that a notch in the semiconductor substrate is rotated 45° from a <110> direction to a <100> direction. The fin structures 5 are then patterned and etched on the rotated substrate so that the fin structures 5 have an upper surface that is planar to a (100) crystal plane and a sidewall surface that is planar to a (100) crystal plane. Both the (100) crystal plane of the upper surface of the fin structure and the (100) crystal plane of the sidewall surface of the fin structure is a preferential deposition surface for epitaxial formation of silicon germanium.

Referring to FIG. 2, each of the fin structures in the plurality of fin structures 5 may have a height $H_1$ ranging from 5 nm to 200 nm. In another embodiment, each of the plurality of fin structures 5 has a height $H_1$ ranging from 10 nm to 100 nm. In one example, each of the plurality of fin structures 5 has a height $H_1$ ranging from 20 nm to 50 nm. Each of the plurality of fin structures 5 may have a width $W_1$ of less than 20 nm. In another embodiment, each of the plurality of fin structures 5 has a width $W_1$ ranging from 3 nm to 8 nm. Although six fin structures are depicted in FIG. 2, the present disclosure is not limited to only this example. It is noted that any number of fin structures may be present in the plurality of fin structures 5. The pitch P1 separating adjacent fin structures in the plurality of fin structures 5 may range from 10 nm to 500 nm. In another example, the pitch P1 separating adjacent fin structures in the plurality of fin structures 5 may range from 20 nm to 50 nm.

Figure 4:
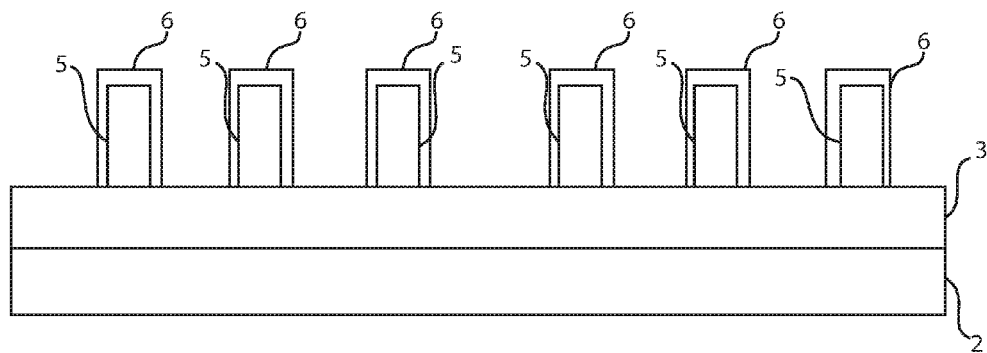
FIG. 4 is a side cross-sectional view depicting one embodiment of forming a germanium including layer on the plurality of fin structures, in accordance with one embodiment of the present disclosure.

FIG. 4 depicts one embodiment of forming a germanium including layer 6 on the plurality of fin structures 5. In the embodiment that is depicted in FIG. 2, the dielectric fin cap 15 is either removed prior to the germanium including layer 6, or the dielectric fin cap 15 is not formed during the process sequence for forming the plurality of fin structures 5. In this embodiment, the germanium including layer 6 is formed on the sidewalls and upper surface of each fin structure in the plurality of fin structures 5. In some embodiments, a dielectric fin cap 15 may be present on the upper surface of the fin structures 5. When the dielectric fin cap 15 is present on the upper surface of the fin structures 5, the germanium including layer 6 is formed on the sidewalls of the fin structures 5, but is obstructed from being formed on the upper surface of the fin structures 5 by the dielectric fin cap 15.

The germanium content of the germanium including layer 6 may range from 5% to 70%, by atomic weight %. In some embodiments, the germanium (Ge) content of the germanium including layer 6 may be greater than 20 at. %. In other embodiments, the germanium (Ge) content of the germanium including layer 6 ranges from 20 at. % to 100 at. %. In another embodiment, the germanium content of the germanium including layer 6 may range from 10% to 40%. In one example, the germanium including layer 6 may be pure germanium (Ge). Examples of materials suitable for the germanium including layer 6 include germanium (Ge), crystalline germanium, single crystal germanium, multicrystalline germanium, silicon germanium doped with carbon (SiGe:C), hydrogenated silicon germanium and combinations thereof.

In one embodiment, forming the germanium including layer 6 over the plurality of fin structures 5 includes epitaxially deposition/epitaxial growth. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

In some embodiments, epitaxial deposition of the germanium including layer 6 is a selective deposition process. For example, although the epitaxially deposited germanium including layer 6 orientates to the crystal arrangement of a semiconductor material, the epitaxially deposited germanium including layer 6 may not be deposited on a dielectric material. In another embodiment, during the epitaxial deposition of the germanium including layer 6 on the fin structures 5, amorphous germanium material is deposited on dielectric surfaces, wherein the amorphous germanium material may be removed selectively, e.g., selectively etched, to the epitaxial germanium including layer 6 formed on fin structures 5.

A number of different sources may be used for the epitaxial deposition of germanium including layer 6. In some embodiments, the gas source for the deposition of an epitaxial germanium including layer 6 may include a germanium including gas sources. For example, an epitaxial germanium including layer 6 may be deposited from a germanium gas source that is selected from the group consisting of germane, digermane, halogermane, dichlorogermane, trichlorogermane, tetrachlorogermane and combinations thereof. In some embodiments, the germanium including gas source may be accompanied by a silicon including source gas that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. The temperature for epitaxial silicon germanium deposition typically ranges from 450° C. to 900° C. Although higher temperature typically results in faster deposition, the faster deposition may result in crystal defects and film cracking.

The epitaxially deposited germanium including layer 6 may be a conformally deposited layer. The term "conformal" denotes a layer having a thickness that does not deviate from greater than or less than 30% of an average value for the thickness of the layer. In one embodiment, the thickness of the germanium including layer 6 may range from 2 nm to 40 nm. In another embodiment, the thickness of the germanium including layer 6 may range from 3 nm to 10 nm.

Figure 5:
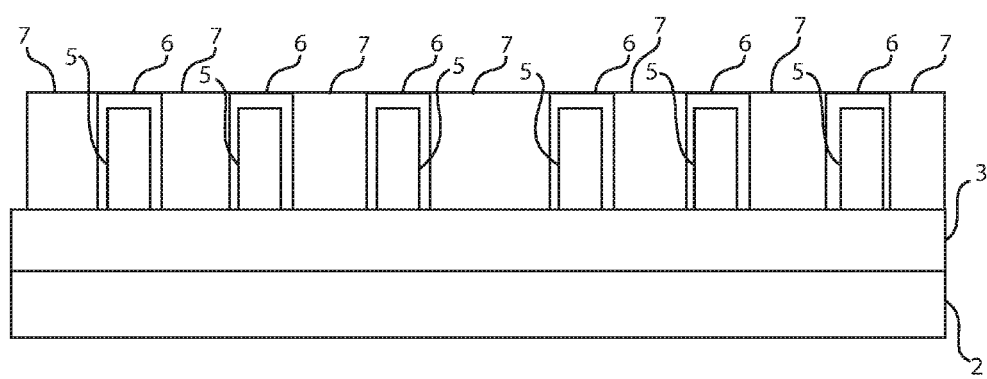
FIG. 5 is a side cross-sectional view depicting forming dielectric regions between adjacent fin structures of the plurality of fin structures, in accordance with one embodiment of the present disclosure.

FIG. 5 depicts one embodiment of forming dielectric regions 7 between adjacent fin structures of the plurality of fin structures 5. The dielectric regions 7 may be composed of a nitride, oxide, oxynitride material, and/or any other suitable dielectric layer. For example, when the dielectric regions 7 are composed of an oxide, the dielectric regions 7 can be silicon oxide ($SiO_2$). In another example, when the dielectric regions 7 are composed of a nitride, the dielectric regions 7 can be silicon nitride. The dielectric regions 7 can be formed by a deposition process, such as CVD. Variations of CVD processes include, but not limited to, Atmospheric Pressure CVD (APCVD), Low Pressure CVD (LPCVD) and PECVD, Metal-Organic CVD (MOCVD) and combinations thereof. Alternatively, the dielectric regions 7 may be formed using a growth process, such as thermal oxidation or thermal nitridation. The dielectric regions 7 may have a thickness ranging from 1 nm to 100 nm.

Figure 6:
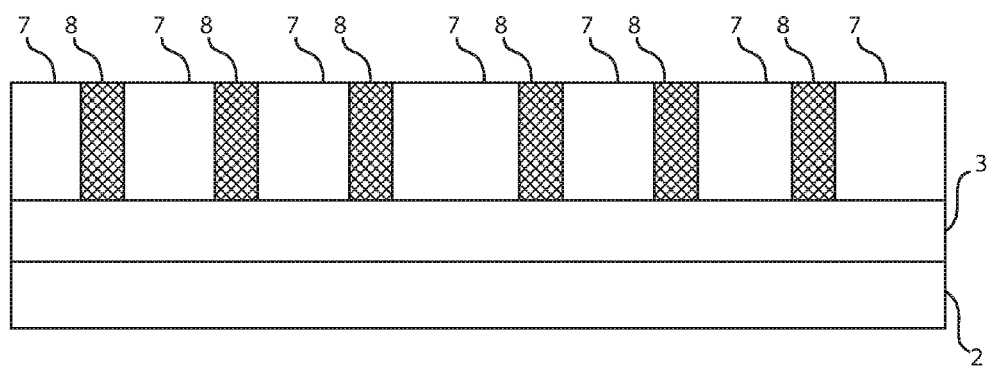
FIG. 6 is a side cross-sectional view depicting one embodiment of diffusing germanium from the germanium including layer into the silicon including fin structures to convert the silicon including fin structures to silicon germanium including fin structures.

FIG. 6 depicts one embodiment of diffusing germanium from the germanium including layer 6 into the silicon including fin structures 5 to convert the silicon including fin structures 5 to silicon germanium including fin structures 8. In some embodiments, the intermixing of the germanium from the germanium including layer 6 into the silicon including fin structures 5 comprises thermal annealing. In one embodiment, the thermal annealing that intermixes the germanium including layer 6 into the silicon including fin structures 5 includes an annealing process selected from the group consisting of rapid thermal annealing (RTA), flash lamp annealing, furnace annealing, laser annealing and combinations thereof. In one embodiment, the thermal annealing for intermixing the germanium including layer 6 into the silicon including fin structures 5 may include a temperature ranging from 550° C. to 1100° C. In another embodiment, the thermal annealing for intermixing the germanium including layer 6 into the silicon including fin structures 5 may include a temperature ranging from 800° C. to 1200° C., and a time period ranging from 10 milliseconds to 100 seconds.

In one embodiment, the intermixing of the germanium including layer 6 into the silicon including fin structures 5 forms silicon germanium including fin structures 8 having a germanium (Ge) content ranging from 10 at. % to 90 at. %. In another embodiment, the silicon germanium including fin structures 8 may have a germanium (Ge) content ranging from 20 at. % to 60 at %. In yet another embodiment, the silicon germanium including fin structures 8 may have a germanium (Ge) content ranging from 30 at. % to 50 at %.

Oxidization of the upper surface of the silicon germanium including fin structures 8 may occur during or after the process steps for intermixing the germanium including layer 6 into the silicon including fin structures 5 that are described above with reference to FIG. 6. For example, in one embodiment in which the oxide layer is formed while intermixing the germanium from the germanium including layer 6 into the silicon including fin structures 5, the thermal processing is performed in an oxygen including atmosphere. The application of the oxygen including atmosphere forms the oxide, e.g., silicon oxide ($SiO_2$), on the upper surface of the silicon germanium including fin structures 8. In some embodiments, silicon (Si) atoms from the silicon germanium (SiGe) layer are preferentially oxidized.

Figure 7:
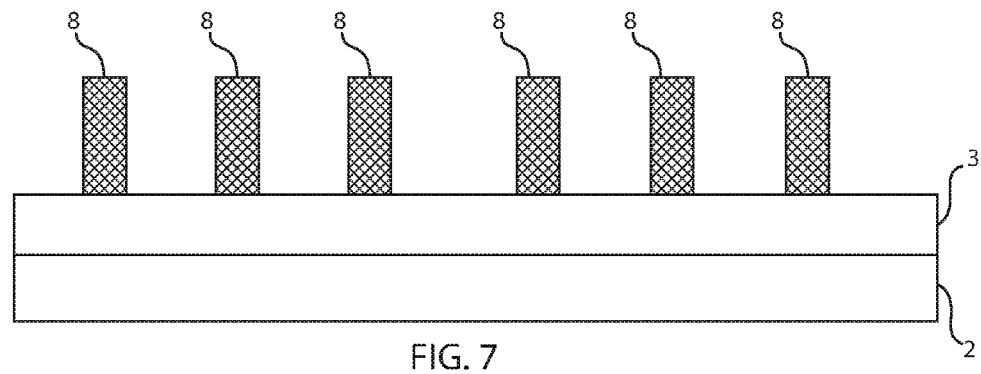
FIG. 7 is a side cross-sectional view depicting removing the dielectric regions from between the adjacent fin structures, in accordance with one embodiment of the present disclosure.

FIG. 7 depicts removing the dielectric regions 7 from between the adjacent fin structures 5. The dielectric regions 7 may be removed using a selective etch process. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. In some embodiments, the dielectric regions 7 are removed by an etch that is selective to the silicon germanium including fin structures 8 and the dielectric layer 3. The etch process for removing the dielectric regions 7 may be an anisotropic etch or an isotropic etch. In some examples, the etch process may be a wet chemical etch, reactive ion etch (RIE), plasma etch, laser etch and combinations thereof.

Figure 8:
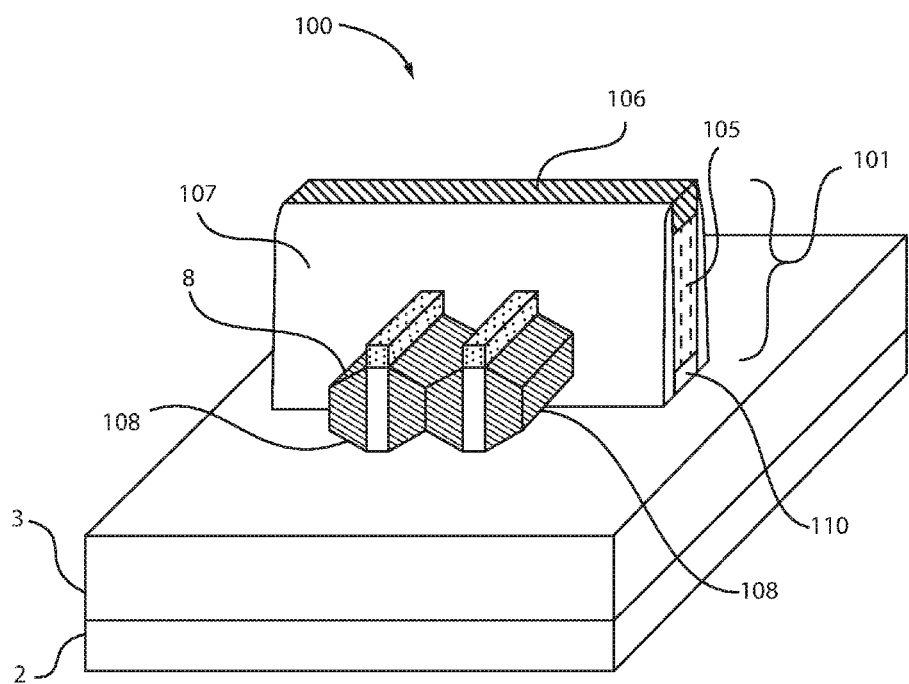
FIG. 8 is a perspective view depicting one embodiment of a finFET semiconductor device that is formed using the method described with reference to FIGS. 1-7, in accordance with the present disclosure.

Following the formation of the silicon germanium including fin structures 8, further processing may be conducted to provide a finFET 100, as depicted in FIG. 8. It is noted that the following process steps for producing a finFET 100 are provided for illustrative purposes and are not intended to limit the disclosure, as additional and intermediate processing steps that are not discussed herein are contemplated and are within the scope of the disclosure. In one example, a gate structure 101 may be formed contacting the silicon germanium including fin structures 8. A "gate structure" is a structure used to control output current (i.e., flow of carriers in the channel) of a semiconducting device through electrical or magnetic fields.

The gate structure 101 may include at least one gate conductor 105 and at least one gate dielectric 110, wherein the gate dielectric 110 is positioned between the gate conductor 105 and the silicon germanium including fin structures 8. The gate dielectric 110 is typically positioned on at least the vertical sidewalls of the fin structure 10. The gate dielectric 110 may be formed by a thermal growth process such as, e.g., oxidation, nitridation or oxynitridation. The gate dielectric 110 may also be formed by a deposition process such as, e.g., CVD, plasma-assisted CVD, MOCVD, ALD, evaporation, reactive sputtering, chemical solution deposition and other like deposition processes. The gate dielectric 110 may also be formed utilizing any combination of the above processes.

The gate dielectric 110 may be comprised of an insulating material having a dielectric constant of about 4.0 or greater. In another embodiment, the gate dielectric 110 is comprised of an insulating material having a dielectric constant greater than 7.0. The dielectric constants mentioned herein are relative to a vacuum. In one embodiment, the gate dielectric 110 employed in the present disclosure includes, but is not limited to, an oxide, nitride, oxynitride and/or silicates including metal silicates, aluminates, titanates and nitrides. In one example, when the gate dielectric 110 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the gate dielectric 110 may vary, but typically, the gate dielectric 110 has a thickness from 1 nm to 10 nm. In another embodiment, the gate dielectric 110 has a thickness from 1 nm to 3 nm.

After forming the material layer for the gate dielectric 110, a blanket layer of a conductive material which forms the gate conductor 105 of gate structure 101 is formed on the gate dielectric 110 utilizing a deposition process, such as physical vapor deposition (PVD), CVD or evaporation. The conductive material may comprise polysilicon, SiGe, a silicide, a metal or a metal-silicon-nitride such as Ta—Si—N. Examples of metals that can be used as the conductive material include, but are not limited to, Al, W, Cu, and Ti or other like conductive metals. The blanket layer of conductive material may be doped or undoped. If doped, an in-situ doping deposition process may be employed. Alternatively, a doped conductive material can be formed by deposition, ion implantation and annealing.

In some embodiments, the gate structure 101 further includes a gate dielectric cap 106. The gate dielectric cap 106 may be a nitride, oxide or oxynitride material. In one embodiment, when the gate dielectric cap 106 is an oxide, the gate dielectric cap 106 may be composed of silicon oxide ($SiO_2$). In one embodiment, when the gate dielectric cap 106 is a nitride, the gate dielectric cap 106 may be composed of silicon nitride (SiN).

After deposition of at least the material layers for the gate dielectric 110, the gate conductor 105 and the gate dielectric cap 106, the gate structure 101 are patterned and etched using photolithography and etch processes. In one embodiment, the gate structures 101 are formed by first providing a patterned mask atop the conductive material by deposition and lithography and then transferring the pattern to the conductive material and the gate dielectric 110. The etching steps may comprise one or more etching processes including dry etching, such as RIE. The region of fin structure 10 in which the gate structure 101 crosses over is the channel region of the silicon germanium including fin structures 8.

At least one dielectric gate spacer 107 may then be formed on the sidewall of the gate structure 101. In one embodiment, the dielectric gate spacer 107 may be formed by using a blanket layer deposition, such as CVD, and an anisotropic etchback method. The dielectric gate spacer 107 may have a width ranging from 2.0 nm to 15.0 nm, and may be composed of a dielectric, such as a nitride, oxide, oxynitride, or a combination thereof.

Still referring to FIG. 8, source and drain regions 108 may be provided on opposing sides of the channel portion of the silicon germanium including fin structures 8. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The channel region is the region underlying the gate structure and between the source and drain of a semiconductor device that becomes conductive when the semiconductor device is turned on.

For example, the source and drain regions 109 may be formed by implanting dopants via ion implantation into each end of the silicon germanium including fin structures 8 to produce n-type conductivity or p-type conductivity dopant regions, i.e., source and drain regions 106. P-type conductivity dopant regions are produced in the silicon germanium including fin structures 8 by doping a portion of the silicon germanium including fin structures 8 with group III-A elements of the periodic table of elements, such as boron.

N-type conductivity is produced in the silicon germanium including fin structures 8 by doping the fin structure 10 with group V elements, such as P or As. In another embodiment, a doped semiconductor materials, such as in-situ doped n-type or p-type semiconductor, may be epitaxially formed on the source and drain portions of the fin structures. In some embodiments, dopant from the in-situ doped n-type or p-type semiconductor may be diffused into the underlying portions of the fin structures to provide source and drain extension regions.

FIGS. 9-12 depicting another embodiment of forming a semiconductor device including a fin structure, in which the source and drain regions of the fin structure 5a are composed of a silicon germanium including material. In the embodiment that is depicted in FIGS. 9-12, the source and drain regions of the fin structure 9 are converted to a silicon germanium including material from silicon including fin structures 5a that originally do not contain germanium, while a gate structure 101a is present over the channel region of the fin structure. The channel region of the fin structure is not processed to introduce germanium, because the gate structure 101a is present over the channel region of the fin structure 5a while the germanium is being deposited on the source and drain regions of the fin structure.

Figure 9:
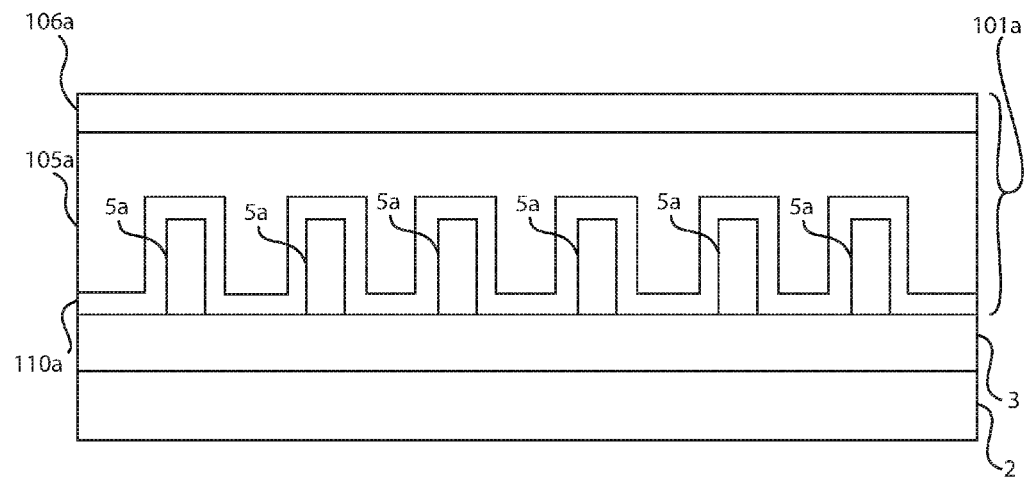
FIG. 9 is a side cross sectional view depicting one embodiment of forming a gate structure on the plurality of fin structures depicted in FIG. 2, in accordance with an embodiment of the present disclosure in which the source and drain portions of the fin structures are converted to a silicon germanium material.

FIG. 9 depicts one embodiment of forming a gate structure 101a on the plurality of fin structures 5a. The fin structures 5a depicted in FIG. 9 are similar to the fin structures 5 that are depicted in FIG. 2. Therefore, the description of the fin structures 5 depicted in FIG. 2 is suitable for the description of the fin structures 5a that are depicted in FIG. 9. For example, the fin structures 5a may be composed of a silicon including material, such as silicon, single crystal silicon, multicrystalline silicon, polycrystalline silicon, amorphous silicon, strained silicon, silicon doped with carbon (Si:C), silicon alloys or any combination thereof. The fin structures 5a that are depicted in FIG. 9 may be substantially free of germanium. The base semiconductor layer 2 and the dielectric layer 3 that are depicted in FIG. 9 have also been described above with reference to FIG. 2.

Still referring to FIG. 9, in one embodiment, the gate structure 101a is formed on the channel portion of the fin structures 5a. In the embodiments that are depicted in FIGS. 9-12, the gate structure 101a is formed on the fin structures 5a prior to forming the germanium including layer that provides the germanium source for converting a portion of the silicon including fin structures 5a to a silicon germanium including material. In the embodiment that is depicted in FIGS. 9-12, by forming the gate structure 101a on the channel portion of the fin structures 5a, prior to forming the germanium including layer, the gate structure 101a functions as a mask so that a germanium dopant is not introduced to the channel region of the fin structures 5a. Because the germanium including layer is only formed only on the source and drain region portions of the fin structures 5a, and the germanium including layer is blocked from being formed on the channel region of the fin structures 5a by the gate structure 101a, in the embodiment that is depicted in FIG. 9 only the source and drain region portions of the fin structures 5a are converted to a silicon germanium including material, whereas the channel region of the fin structures 5a remains free of germanium, e.g., is composed of silicon.

The gate structure 101a that is depicted in FIG. 9 includes at least one gate dielectric 110a, at least one gate conductor 105a and at least one gate dielectric cap 106a. The gate structure 101a that is depicted in FIG. 9 is similar to the gate structure 101 that is depicted in FIG. 8. Therefore, the description of the gate structure 101 including the at least one gate dielectric 110, the at least one gate conductor 105 and the at least one gate dielectric cap 106 that is depicted in FIG. 8 is suitable for the description of the gate structure 101a including the at least one gate dielectric 110a, the at least one gate conductor 105a and the at least one gate dielectric cap 106a that is depicted in FIG. 9.

Figure 10:
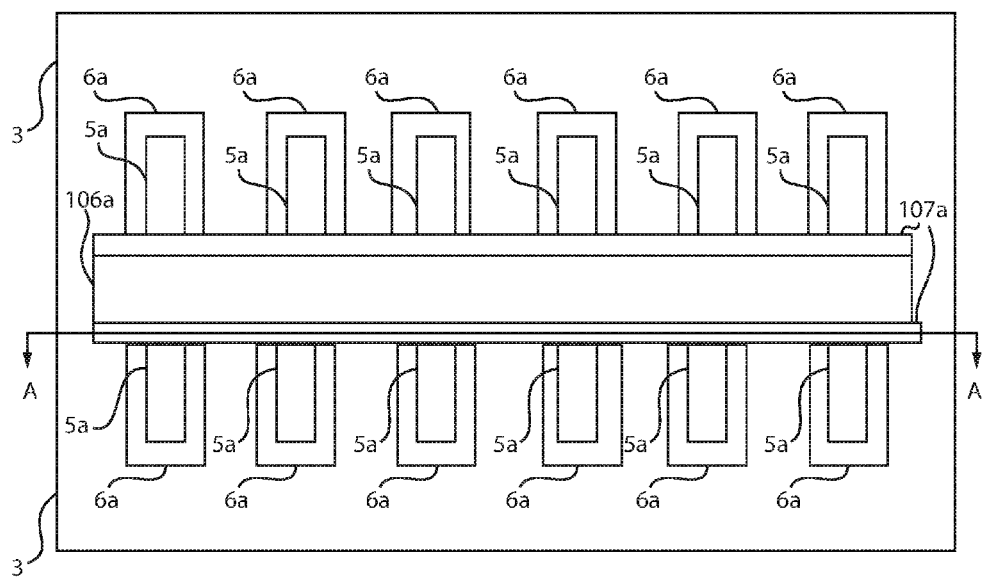
FIG. 10 is a top down view depicting one embodiment of forming a germanium including layer on exposed source and drain region portions of the plurality of fin structures that are present on opposing sides on the channel portion of the plurality of fin structures depicted in FIG. 9, in accordance with the present disclosure.
Figure 11:
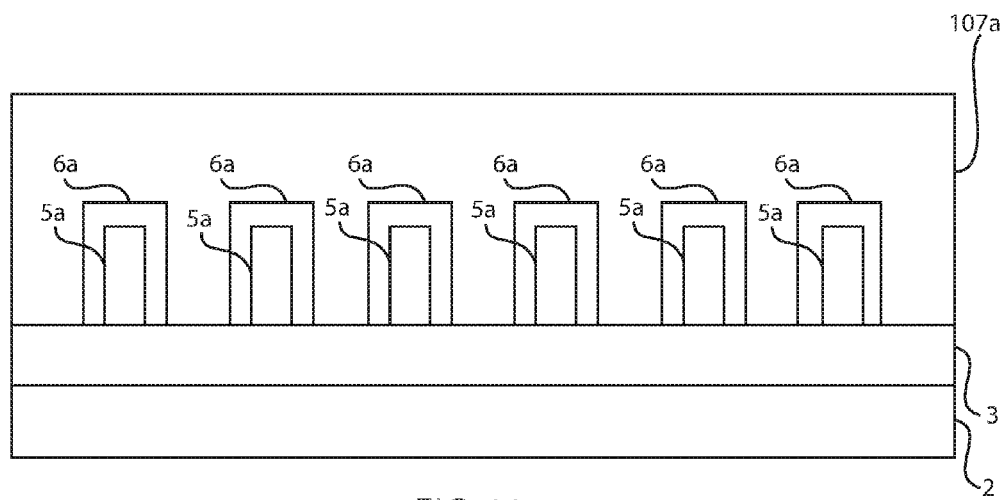
FIG. 11 is a side cross sectional view along section line A-A of FIG. 10.

FIGS. 10 and 11 depicts one embodiment of forming at least one dielectric gate spacer 107a on the sidewall of the gate structure 101a. The description of forming the at least one dielectric gate spacer 107 that is depicted in FIG. 8 is suitable for the description of the at least one dielectric gate spacer 107a that is depicted in FIG. 10.

FIGS. 10 and 11 also depict forming a germanium including layer 6a on the exposed source and drain region portions of the plurality of fin structures 5a that are present on opposing sides on the channel portion of the plurality of fin structures 5a depicted in FIG. 9. The germanium including layer 6a that is depicted in FIGS. 10 and 11 is similar to the germanium including layer 6 that is depicted in FIG. 4. Therefore, the description for the germanium including layer 6 that is depicted in FIG. 4 is suitable for the germanium including layer 6a that is depicted in FIGS. 10 and 11.

The germanium including layer 6a that is depicted in FIGS. 10 and 11 is only formed on the source and drain region portions of the fin structures 5a, while the germanium including layer 6a is obstructed from being formed on the channel region of the fin structures 5a. In some embodiments, the germanium including layer 6a is formed using an epitaxial deposition process that may be selective. For example, the germanium including layer 6a may be epitaxially deposited on exposed semiconductor including materials, such as the source and drain regions portions of the fin structures 5a, in which an epitaxially deposited germanium including layer will not be formed on dielectric surfaces, such as the dielectric gate spacer 107a and the gate dielectric cap 106a.

In another example, the epitaxially formed germanium including layer 6a that is present on the source and drain region portions of the fin structures 5a will have a crystalline structure, such as being single crystalline or multi-crystalline, whereas material that is formed on the dielectric gate spacer 107a and the gate dielectric cap 106a during the epitaxial deposition process is amorphous. The amorphous portions of semiconductor material that is formed on the dielectric gate spacer 107a and the gate dielectric cap 106a during the epitaxial deposition process that forms the crystalline portion of the epitaxially formed germanium including layer 6a may then be removed by a selective etch process. For example, the amorphous portions of semiconductor material that is formed on the dielectric gate spacer 107a and the gate dielectric cap 106a may be removed selectively to the epitaxially formed germanium including layer 6a that is present on the source and rain region portions of the fin structures 5a. The selective etch process may be an anisotropic or isotropic etch, such as reactive ion etch, plasma etch, wet chemical etch, and combinations thereof.

Figure 12:
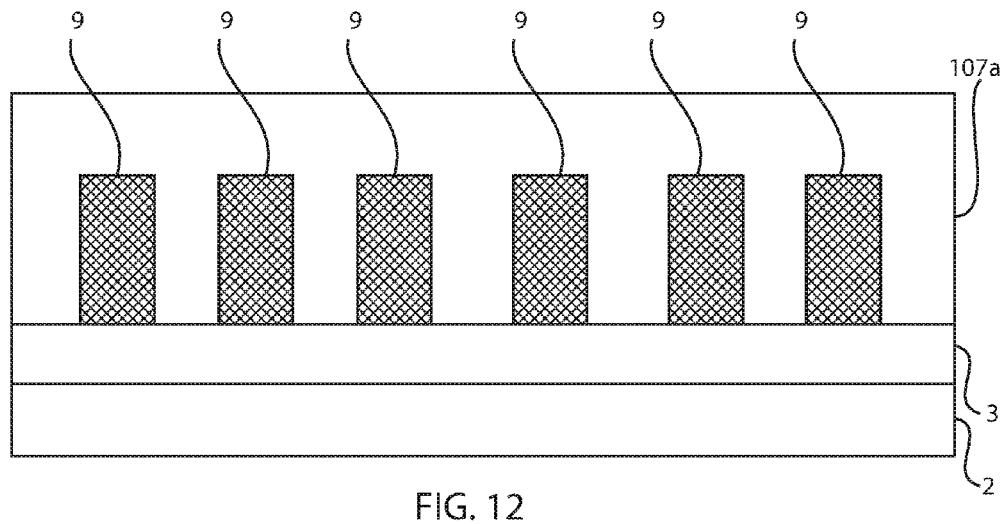
FIG. 12 is a side cross sectional view of diffusing germanium from the germanium including layer into the silicon including fin structures depicted in FIG. 11 to convert the source and drain region portions of the silicon including fin structures to a silicon germanium including material, in accordance with one embodiment of the present disclosure

FIG. 12 depicts one embodiment of diffusing germanium from the germanium including layer 6a into the silicon including fin structures to convert the source and drain region portions of the silicon including fin structures to a silicon germanium including material 9 (also referred to as silicon germanium including material source and drain region portions 9 of the fin structure). In some embodiments, the intermixing of the germanium from the germanium including layer into the silicon including fin structures comprises thermal annealing. In one embodiment, the thermal annealing that intermixes the germanium including layer into the silicon including fin structures comprise an annealing process selected from the group consisting of rapid thermal annealing (RTA), flash lamp annealing, furnace annealing, laser annealing and combinations thereof. In one embodiment, the thermal annealing for intermixing the germanium including layer 6a into the silicon including fin structures may include a temperature ranging from 800° C. to 1200° C., and a time period ranging from 10 milliseconds to 100 seconds.

In one embodiment, the intermixing of the germanium including layer into the source and drain region portions of the silicon including fin structures forms silicon germanium including material source and drain region portions 9 of the fin structure that have a germanium (Ge) content ranging from 10 at. % to 90 at. %. In another embodiment, the silicon germanium including material source and drain region portions 9 of the fin structures may have a germanium (Ge) content ranging from 20 at. % to 60 at. %. In yet another embodiment, the silicon germanium including material source and drain region portions 9 of the fin structure may have a germanium (Ge) ranging from 30 at. % to 50 at. %.

Oxidation of the upper surface of the silicon germanium including material source and drain region portions 9 of the fin structure may occur during or after the process steps for intermixing the germanium including layer into the silicon including fin structures that are described above with reference to FIG. 12. The oxide layer that is formed on the silicon germanium including material source and drain region portions 9 of the fin structure may be removed by a selective etch process.

Source and drain regions may be formed on the silicon germanium including material source and drain region portions 9 of the fin structure. In some embodiments, the silicon germanium including material source and drain region portions 9 of the fin structure may be doped with an n-type dopant to provide an n-type finFET. In some embodiments, the silicon germanium including material source and drain region portions 9 of the fin structure may be doped with a p-type dopant to provide a p-type finFET. Further details for doping the source and drain region portions of the fin structures have been provided above for forming the source and drain regions 108 that are depicted in FIG. 8.

FIGS. 13-18 depict another embodiment of the present disclosure in which only the channel region portion 9' of a fin structure 5b is converted from a silicon including material with substantially no germanium to a silicon germanium including material. The process flow that is depicted in FIGS. 13-18 may employ a replacement gate sequence for forming a finFET semiconductor device. As used herein, the term "replacement gate structure" denotes a sacrificial structure that dictates the geometry and location of the later formed functioning gate structure. The "functional gate structure" functions to switch the semiconductor device from an "on" to "off" state, and vice versa.

Figure 13:
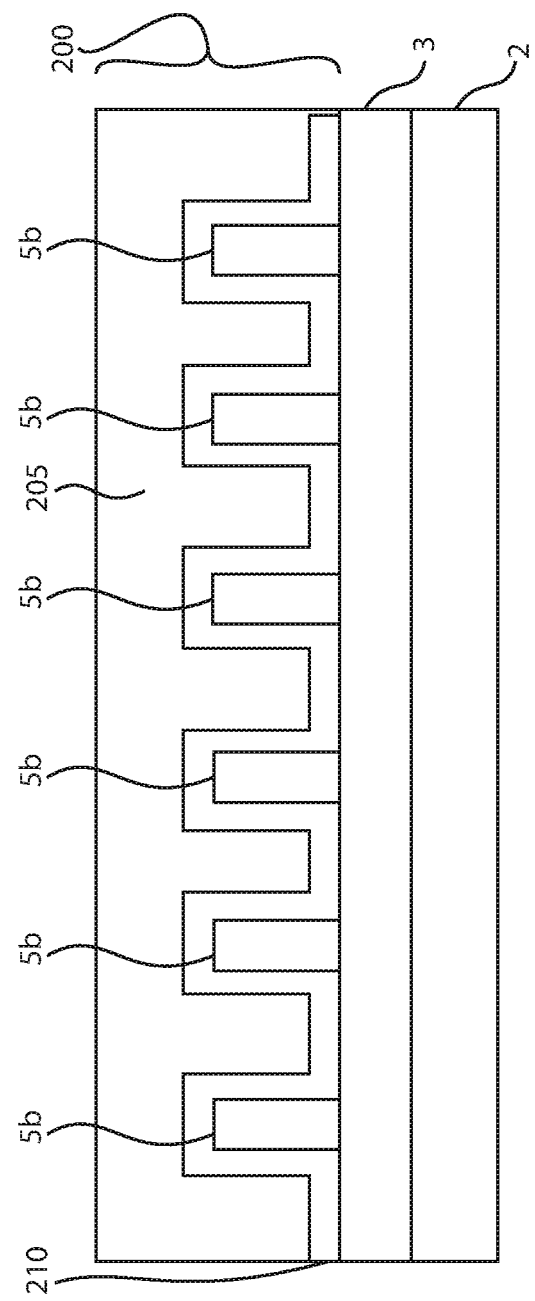
FIG. 13 is a side cross sectional view depicting one embodiment of forming a replacement gate structure on the plurality of fin structures depicted in FIG. 2, in accordance with an embodiment of the present disclosure in which the channel portion of the fin structures are converted to a silicon germanium material.

FIG. 13 depicts one embodiment of forming a replacement gate structure 200 on the plurality of fin structures 5b. The plurality of fin structures 5b are similar to the plurality of fin structures 5 that are depicted in FIG. 2. Therefore, in one embodiment, the description of the plurality of fin structures 5 that are depicted in FIG. 2 are suitable for describing the plurality of fin structures 5b that are depicted in FIG. 13.

In one embodiment, the sacrificial material that provides the replacement gate structure 200 may be composed of any material that can be etched selectively to the fin structures 5b and the dielectric layer 3. In one embodiment, the replacement gate structure 200 is a multilayered structure of a replacement gate dielectric layer 210 and a replacement gate conductor layer 205. In one embodiment, the sacrificial material that provides the replacement gate conductor layer 205 may be composed of a silicon-including material, such as polysilicon. In one embodiment, the replacement gate dielectric layer 210 may be composed of a dielectric material, such as an oxide, nitride or oxynitride material, or amorphous carbon. The sacrificial materials may be patterned and etched to provide the replacement gate structure 200. It is noted that the replacement gate structure 200 is not limited to only the example that is depicted in FIG. 13. For example, the replacement gate structure 200 may be composed of any number of material layers and any number of material compositions, so long as the replacement gate structure can be removed selectively to the plurality of fin structures 5b.

Figure 14:
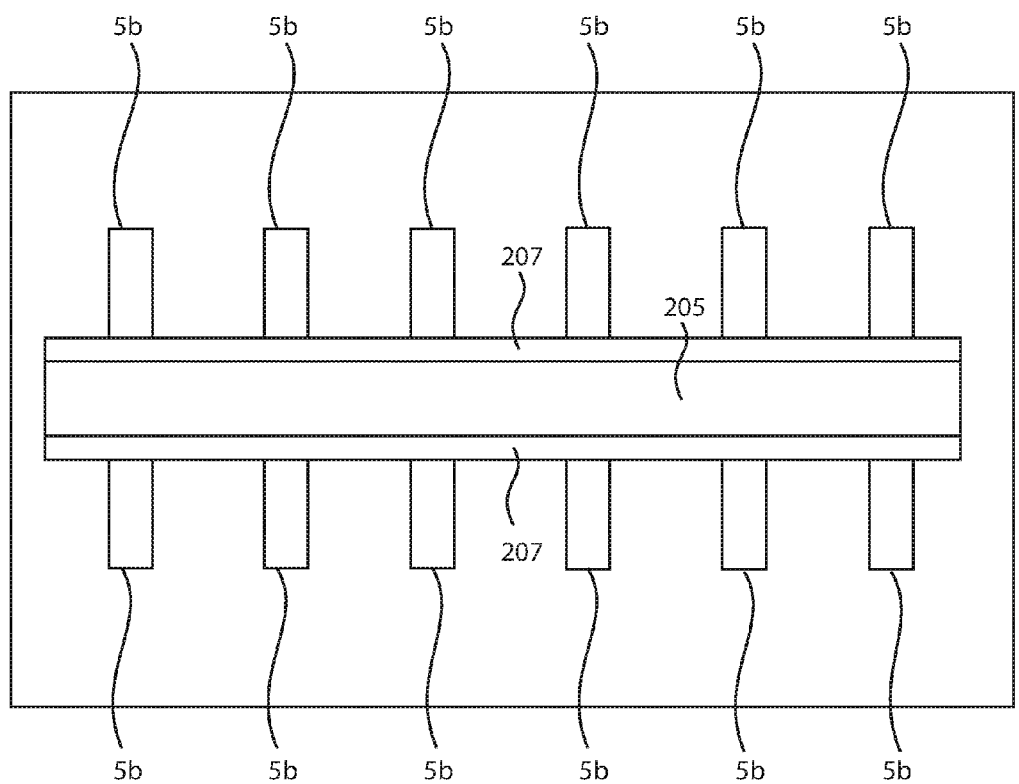
FIG. 14 is a top down view depicting one embodiment of forming a dielectric spacer on the sidewall of the replacement gate structure that is depicted in FIG. 13.

FIG. 14 depicts one embodiment of forming a dielectric spacer 207 on the sidewall of the replacement gate structure 205 that is depicted in FIG. 13. The dielectric spacer 207 that is depicted in FIG. 14 is similar to the dielectric spacer 107 that is described above with reference to FIG. 8. In some embodiments, extension source region and the extension drain region (not shown) may then be formed in the source region and drain region portions of the fin structures 5b that are present on opposing sides of replacement gate structure 200. In one embodiment, the extension source region and the extension drain region are formed using in situ doping, an ion implantation process, plasma doping, gas phase diffusion, diffusion from a doped oxide or a combination thereof. The extension source and drain regions may be doped to an n-type or p-type conductivity. In some embodiments, raised source and drain regions (not shown) may be formed on the source and drain extension regions. The raised source and drain regions may be composed of in-situ doped semiconductor material and may have a same conductivity type as the source and drain extension regions.

Figure 15:
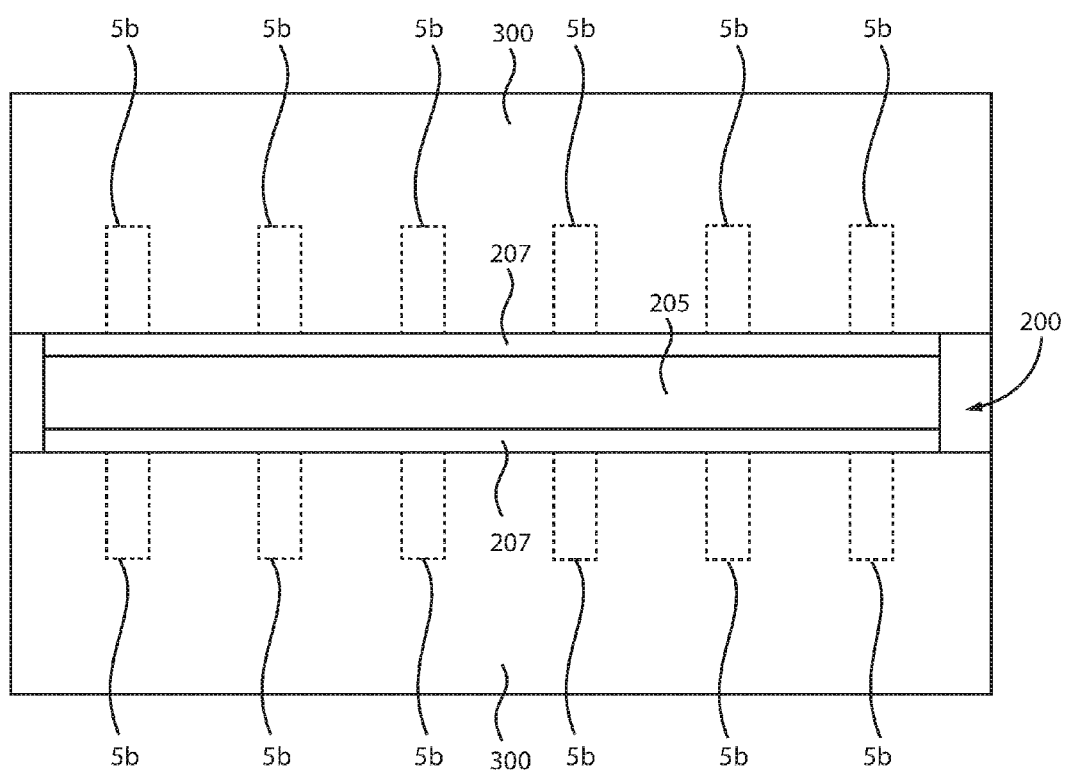
FIG. 15 is a top down view depicting forming a dielectric material on the source region portion and the drain region portion of the plurality of fin structures depicted in FIG. 14, in accordance with the present disclosure.

FIG. 15 depicts one embodiment of forming a dielectric material 300 on the source region portion and the drain region portion of the plurality of fin structures 5b depicted in FIG. 14. The dielectric material 300 may be selected from the group consisting of silicon-including materials such as $SiO_2$, SiN, $Si_3N_4$, $SiO_xN_y$, SiC, SiCO, SiCOH, and SiCH compounds; the above-mentioned silicon including materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). The dielectric material 300 may be deposited using at least one of spinning from solution, spraying from solution, chemical vapor deposition (CVD), plasma enhanced CVD (PECVD), sputter deposition, reactive sputter deposition, ion-beam deposition, and evaporation. Following deposition of the dielectric material 300, a planarization processes is conducted so that the upper surface of the dielectric layer 300 is coplanar with the upper surface of the replacement gate structure 200. The planarization of the dielectric material 300 may be provided by chemical mechanical planarization.

Figure 16:
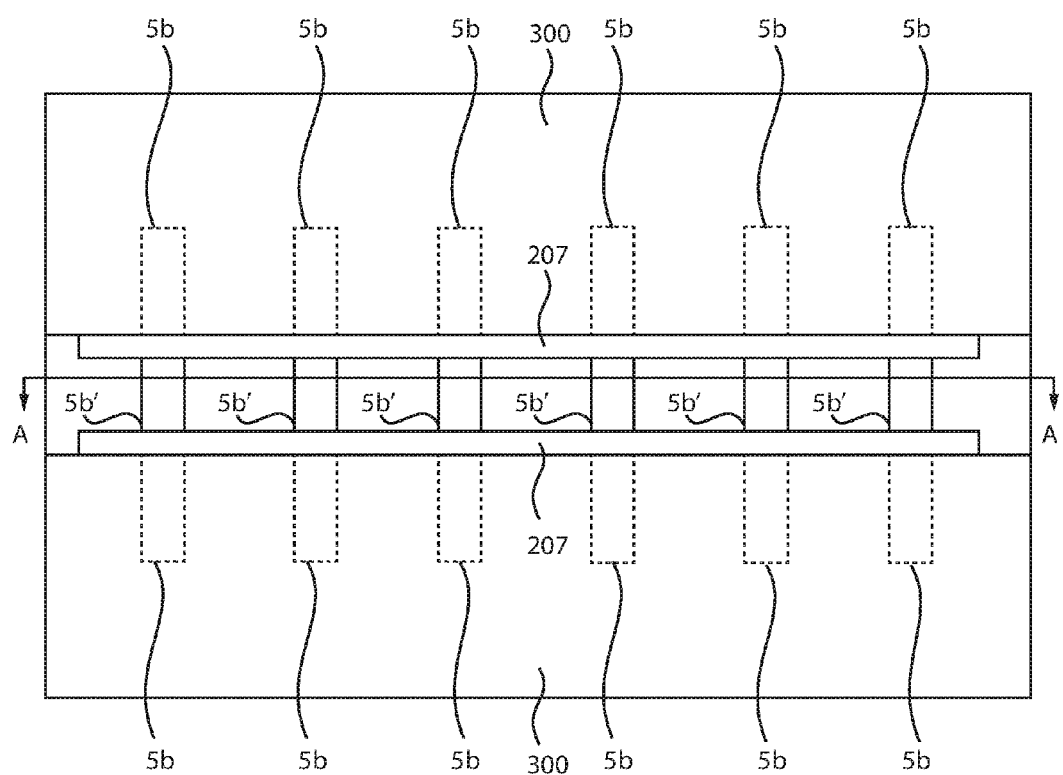
FIG. 16 is a top down view depicting removing the replacement gate structure from the structure depicted in FIG. 15, in accordance with one embodiment of the present disclosure.

FIG. 16 depicts one embodiment of removing the replacement gate structure 200 to expose a channel region portion of the plurality of fin structures 5b. In some embodiments, the replacement gate structure 200 may be removed by a selective etch process. The replacement gate structure 200 may be removed using a wet or dry etch process. In one embodiment, the replacement gate structure 200 is removed by reactive ion etch (RIE). In one example, an etch step for removing the replacement gate structure 200 can include an etch chemistry for removing the replacement gate structure 200 selective to the plurality of fin structure 5b.

Figure 17:
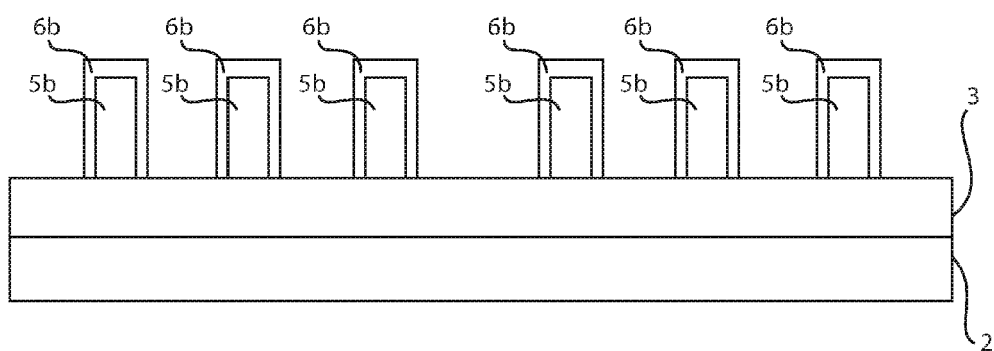
FIG. 17 is a side cross sectional view along section line A-A of the structure depicted in FIG. 16 after forming a germanium including layer on the channel portion of the plurality of fin structures, in accordance with one embodiment of the present disclosure.

FIG. 17 depicts forming a germanium including layer 6b on the channel portion of the plurality of fin structures 5b. The germanium including layer 6b that is depicted on the channel portion of the plurality of fin structure 5b is similar to the germanium including layer 6 that is depicted in FIG. 3, and the germanium including layer 6a that is depicted in FIG. 10. Therefore, the description for the germanium including layer 6 that is depicted in FIG. 4, and the germanium including layer 6a that is depicted in FIG. 10, is suitable for the germanium including layer 6b that is depicted in FIG. 17.

The germanium including layer 6b that is depicted in FIG. 17 is only formed on the channel region portion of the fin structures 5b, while the germanium including layer 6b is obstructed from being formed on the source and drain region portions of the fin structures 5b by the dielectric material 300. In some embodiments, the germanium including layer 6b is formed using an epitaxial deposition process that may be selective. For example, the germanium including layer 6b may be epitaxially deposited on exposed semiconductor including materials, such as the channel region portion of the fin structure 5b, in which an epitaxially deposited germanium including layer will not be formed on dielectric surfaces, such as the dielectric material 300 that is present over the source and drain region portions of the fin structures 5b.

In another example, the epitaxially formed germanium including layer 6a that is present on the channel region portion of the fin structures 5b will have a crystalline structure, such as being single crystalline or multi-crystalline, whereas material that is formed on the dielectric material 300 during the epitaxial deposition process is amorphous. The amorphous portions of semiconductor material that is formed on the dielectric material 300 may be removed by a selective etch process.

Figure 18:
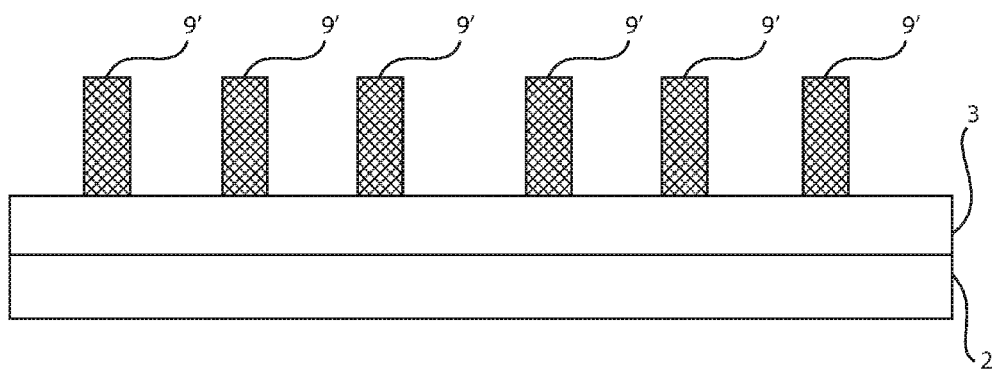
FIG. 18 is a side cross sectional view depicting diffusing germanium from the germanium including layer into the channel portion of the silicon including fin structures to convert the channel portion of the plurality of the silicon including fin structures to a silicon germanium including material, in accordance with one embodiment of the present disclosure.

FIG. 18 depicts one embodiment of diffusing germanium from the germanium including layer into the channel region portion of the silicon including fin structures to convert the channel region portion of the silicon including fin structures to a silicon germanium including material 9' (also referred to as silicon germanium including material channel portion 9' of the fin structure). In some embodiments, the intermixing of the germanium from the germanium including layer into the silicon including fin structures comprises thermal annealing. In one embodiment, the thermal annealing that intermixes the germanium including layer into the silicon including fin structures comprise an annealing process selected from the group consisting of rapid thermal annealing (RTA), flash lamp annealing, furnace annealing, laser annealing and combinations thereof. In one embodiment, the thermal annealing for intermixing the germanium including layer into the silicon including fin structures may include a temperature ranging from 800° C. to 1200° C., and a time period ranging from 10 milliseconds to 100 seconds.

In one embodiment, the intermixing of the germanium including layer into the channel region portion of the silicon including fin structures forms a silicon germanium including material channel region portion 9' of the fin structures that has a germanium (Ge) content ranging from 10 at. % to 90 at. %. In another embodiment, the silicon germanium including material channel region portion 9' of the fin structures may have a germanium (Ge) content ranging from 20 at. % to 60 at %. In yet another embodiment, the silicon germanium including material channel portion 9' of the fin structure may have a germanium (Ge) ranging from 30 at. % to 50 at %.

A functional gate structure may be formed on the silicon germanium including material channel region portion 9' of the fin structures 5b. Further details for forming the functional gate structure are provided above for forming the gate structure identified by reference number 101 in FIG. 8. The functional gate structure includes at least one gate dielectric and at least one gate conductor. The functional gate structure is formed in the space that is provided by removing the replacement gate structure 200.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
   forming a silicon including fin structure having an upper surface that is planar to a (100) crystal plane and a sidewall surface that is planar to a (100) crystal plane;
   forming a germanium including layer on an upper surface and sidewalls surface of the silicon including fin structure;
   forming dielectric regions adjacent the silicon including fin structure;
   diffusing germanium from the germanium including layer into the silicon including fin structure to convert the silicon including fin structure to a silicon germanium including fin structure; and
   removing the dielectric regions in their entirety after forming the silicon germanium including fin structure,
   wherein the silicon including fin structure includes a plurality of silicon including fin structures, and diffusing germanium from the germanium including layer into the silicon including fin structure includes forming a plurality of silicon germanium including fin structures; and
   wherein the forming of the dielectric regions between adjacent fin structures of the plurality of silicon including fin structures comprises:
      depositing an oxide between the adjacent fin structures of the plurality of silicon including fin structures; and
      planarizing an upper surface of the oxide to be planar with an upper surface of the plurality of silicon including fin structures.

2. The method of claim 1, wherein said forming the silicon including fin structure comprises:
   rotating a semiconductor substrate so that a notch in the semiconductor substrate is rotated 45° from a <110> direction to a <100> direction.

3. The method of claim 1, wherein the forming the plurality of the silicon including fin structures comprises etching a semiconductor on insulator (SOI) layer of a semiconductor on insulator (SOI) substrate selectively to an insulator layer of the SOI substrate, wherein a remaining portion of the SOI layer provides the plurality of the silicon including fin structures.

4. The method of claim 1, wherein the forming of the germanium including layer on the plurality of fin silicon including structures comprises conformably depositing a semiconductor material selected from the group consisting of germanium, silicon germanium, silicon germanium doped with carbon, hydrogenated germanium, hydrogenated silicon germanium, hydrogenated silicon germanium doped with carbon and combinations thereof.

5. The method of claim 1, wherein the diffusing of the germanium from the germanium including layer into the plurality of silicon including fin structures comprises:
annealing the plurality of silicon including fin structures and the germanium including layer at a temperature ranging from 550° C. to 1100° C.; and
etching to remove an oxide including surface from the plurality of silicon germanium including fin structures.

6. A method of forming a semiconductor device comprising:
forming a plurality of silicon including fin structures;
forming a gate structure on a channel portion of the plurality of silicon including fin structures;
forming a germanium layer on exposed portions of the plurality of silicon including fin structures on opposing sides on the channel portion;
forming dielectric regions between adjacent fin structures of the plurality of silicon including fin structures;
diffusing germanium from the germanium including layer into the plurality of silicon including fin structures to convert at least one of a source region portion of the plurality of silicon including fin structures and a drain region portion of the plurality of silicon including fin structures to a silicon germanium including material; and
removing the dielectric regions in their entirety after converting the at least one of a source region portion and the drain region portion,
wherein the forming of the dielectric regions between adjacent fin structures of the plurality of silicon including fin structures comprises:
depositing an oxide between the adjacent fin structures of the plurality of silicon including fin structures; and
planarizing an upper surface of the oxide to be planar with an upper surface of the plurality of silicon including fin structures.

7. The method of claim 6, wherein the forming the plurality of the silicon including tin structures comprises etching a semiconductor on insulator (SOI) layer of a semiconductor on insulator (SOI) substrate selectively to an insulator layer of the SOI substrate, wherein a remaining portion of the SOI layer provides the plurality of the silicon including fin structures.

8. The method of claim 6, wherein the plurality of silicon including fin structures are silicon fin structures prior to said least one of the source region portion of the plurality of silicon including fin structures and the drain region portion of the plurality of silicon including fin structures being converted to the silicon germanium including material.

9. The method of claim 6, wherein the forming of the germanium including layer comprises conformally depositing the germanium including layer of a semiconductor material selected from the group consisting of germanium, silicon germanium, silicon germanium doped with carbon, hydrogenated germanium, hydrogenated silicon germanium, hydrogenated silicon germanium doped with carbon and combinations thereof.

10. The method of claim 6, wherein the diffusing of the germanium from the germanium including layer into the plurality of silicon including fin structures to convert the plurality of silicon including fin structures to silicon germanium including fin structures comprises:
annealing the plurality of silicon including fin structures and the germanium including layer at a temperature ranging from 550° C. to 1100° C.; and
etching to remove an oxide including surface from the silicon germanium including material.

11. A method of forming a semiconductor device comprising:
forming a plurality of silicon including fin structures;
forming a replacement gate structure on a channel portion of the plurality of the silicon including fin structures;
forming a dielectric material on a source region portion and a drain region portion of the plurality of silicon including fin structures;
removing the replacement gate structure to expose the channel portion of the plurality of silicon including fin structures;
forming a germanium including layer on the channel portion of the plurality of silicon including fin structures;
diffusing germanium from the germanium including layer into the channel portion of the silicon including fin structures to convert the channel portion of the plurality of the silicon including fin structures to a silicon germanium including material; and
removing the dielectric material in its entirety after converting the source region portion and the drain region portion,
wherein the forming of the dielectric material on the source region portion and the drain region portion of the plurality of silicon including fin structures comprises:
depositing an oxide between the fin structures of the plurality of silicon including fin structures; and
planarizing an upper surface of the oxide to be planar with an upper surface of the plurality of silicon including fin structures.

12. The method of claim 11, further comprises forming a functional gate structure on the channel portion of the plurality of fin structures of the silicon germanium including material.

13. The method of claim 11, further comprising forming a source region and a drain region of an n-type or p-type conductivity in the source region portion and the drain region portion of the plurality of silicon including fin structures prior to forming the dielectric material.

14. The method of claim 11, wherein the forming the plurality of the silicon including fin structures comprises etching a semiconductor on insulator (SOI) layer of a semiconductor on insulator (SOI) substrate selectively to an insulator layer of the SOI substrate, wherein a remaining portion of the SOI layer provides the plurality of the silicon including fin structures.

15. The method of claim 11, wherein the forming of the germanium including layer comprises conformity depositing a semiconductor material that is selected from the group consisting of germanium, silicon germanium, silicon germanium doped with carbon, hydrogenated germanium, hydrogenated silicon germanium, hydrogenated silicon germanium doped with carbon and combinations thereof.

16. The method of claim 11, wherein the diffusing of the germanium from the germanium including layer into the channel portion of the plurality of silicon including fin structures comprises:
annealing the silicon including fin structures and the germanium including layer at a temperature ranging from 550° C. to 1100° C.; and etching to remove an oxide including surface from the silicon germanium including material.

17. The method of claim 11, wherein the silicon including fin strictures have an upper surface that is planar to a (100) crystal plane and a sidewall surface that is planar to a (100) crystal plane.

* * * * *